(12) United States Patent
Schrom et al.

(10) Patent No.: US 7,236,410 B2
(45) Date of Patent: Jun. 26, 2007

(54) MEMORY CELL DRIVER CIRCUITS

(75) Inventors: Gerhard Schrom, Hillsboro, OR (US); Fabrice Paillet, Hillsboro, OR (US); Tanay Karnik, Portland, OR (US); Dinesh Somasekhar, Portland, OR (US); Yibin Ye, Portland, OR (US); Ali Keshavarzi, Portland, OR (US); Muhammad M. Khellah, Tigard, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 95 days.

(21) Appl. No.: 11/169,106

(22) Filed: Jun. 27, 2005

(65) Prior Publication Data

US 2006/0291265 A1 Dec. 28, 2006

(51) Int. Cl.
*G11C 7/00* (2006.01)
*G11C 17/00* (2006.01)
*G11C 5/06* (2006.01)

(52) U.S. Cl. ........................ 365/189.11; 365/94; 365/63
(58) Field of Classification Search ........... 365/189.11, 365/94
See application file for complete search history.

(56) References Cited

U.S. PATENT DOCUMENTS

| 6,515,344 | B1 | 2/2003 | Wollesen |
| 6,686,791 | B2 | 2/2004 | Zheng et al. |
| 6,693,481 | B1 | 2/2004 | Zheng |
| 7,126,871 | B2* | 10/2006 | Marr et al. ............... 365/225.7 |
| 7,158,412 | B2* | 1/2007 | Rodgers et al. ......... 365/185.18 |
| 2002/0141249 | A1* | 10/2002 | Tedrow et al. ......... 365/189.11 |
| 2006/0126377 | A1* | 6/2006 | Honda et al. ............... 365/158 |

* cited by examiner

*Primary Examiner*—Amir Zarabian
*Assistant Examiner*—Ly Duy Pham
(74) *Attorney, Agent, or Firm*—Buckley, Maschoff & Talwalkar LLC

(57) ABSTRACT

A system includes a pull-up circuit to program a memory cell. The pull-up circuit may include a level shifter to receive a control signal, a supply voltage, and one or more of a plurality of rail voltages, each of the plurality of rail voltages substantially equal to a respective integer multiple of the supply voltage, and to generate a second control signal, and a cascode stage. The cascode stage may include a plurality of transistors, a gate voltage of each of the plurality of transistors to be controlled at least in part by a respective one of the second control signal, the supply voltage, and at least one of the plurality of rail voltages, and an output node to provide a cell programming signal.

17 Claims, 10 Drawing Sheets

| Mode | Enable | Bit Line | Word Line |
|---|---|---|---|
| Read | N | GND | GND |
|  | Y | sense | Vcc |
| Write | N | Vprog | GND |
|  | Y | GND | Vprog |

| Function | d | y | Vg1 | Vd2 | Vg2 | Vd3 | Vg3 | Vd4 | Vg4 |
|---|---|---|---|---|---|---|---|---|---|
| open | 0 | 0 | Vcc | Vcc | 2Vcc | 2Vcc | 3Vcc | 3Vcc | 4Vcc |
| Vprog | 1 | 4Vcc | 3Vcc | 4Vcc | 3Vcc | 4Vcc | 3Vcc | 4Vcc | ~3Vcc |

| Function | y | s | c0n | c0p | d | x | Vgp3 | Vgp2 | Vgp1 | Vg3 | Vd2 |
|---|---|---|---|---|---|---|---|---|---|---|---|
| GND | 0 | 0 | 1 | 1 | 0 | open | 0 | 0 | 0 | Vcc | 0 |
| sense | Vbl | Vbl | 0 | 1 | 0 | open | 0 | 0 | 0 | Vcc | Vbl |
| Vcc | Vcc | Vcc | 0 | 0 | 0 | open | 0 | 0 | 0 | Vcc | Vcc |
| Vprog | 4Vcc | Vcc | 0 | 1 | 1 | 4Vcc | 4Vcc | 3Vcc | 2Vcc | 2Vcc | 2Vcc |

|  |  | Enable | c0n | c0p | d | Output |
|---|---|---|---|---|---|---|
| Bit line | read | N | 1 | 1 | 0 | GND |
|  |  | Y | 0 | 1 | 0 | Sense |
|  | write | N | 0 | 1 | 1 | Vprog |
|  |  | Y | 1 | 1 | 0 | GND |
| Word line | read | N | 1 | 1 | 0 | GND |
|  |  | Y | 0 | 0 | 0 | Vcc |
|  | write | N | 1 | 1 | 0 | GND |
|  |  | Y | 0 | 1 | 1 | Vprog |

FIG. 6B

MEMORY CELL DRIVER CIRCUITS

BACKGROUND

A memory cell driver circuit may be used to write a value to and/or read a value from a memory cell. In the case of a One-Time Programmable (OTP) memory cell, which is a type of Programmable Read Only Memory, a value is written to the memory cell once and cannot be overwritten during conventional operation. Writing values to (i.e., programming) arrays of conventional OTP memory cells requires high voltages and currents. Driver circuits for these arrays may use thick-oxide transistors to supply the currents and to withstand the voltages. Some OTP memory cells, such as poly-Si-fuse memory cells, are programmed using a dedicated driver circuit for each cell. Each dedicated driver circuit typically includes a large VDNMOS device. Such implementations may be inefficient in terms of one or more of fabrication cost, die footprint, power consumption and other factors.

BRIEF DESCRIPTION OF THE DRAWINGS

FIG. 6B is a table of control, internal and output voltages corresponding to different functions of the FIG. 6A circuit according to some embodiments.

DETAILED DESCRIPTION

Figures 1A, 1B:
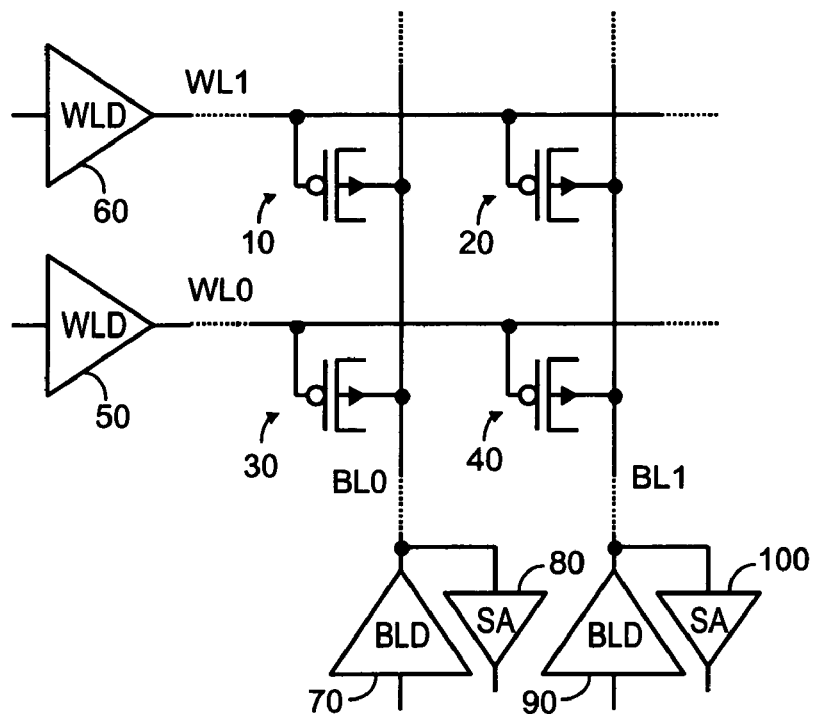
FIG. 1A is a schematic diagram of an OTP memory cell array.
FIG. 1B is a table of voltages for reading and programming an OTP memory cell according to some embodiments.

FIG. 1A is a schematic-diagram showing a 2×2 array of OTP memory cells according to some embodiments. The gate of each of memory cells 10 through 40 is coupled to one of Word Lines WL0 and WL1, and the drain of each of memory cells 10 through 40 is coupled to one of Bit Lines BL0 and BL1. Voltages on Word Lines WL0 and WL1 are controlled by associated Word Line Drivers (WLDs) 50 and 60, and voltages on Bit Lines BL0 and BL1 are controlled by associated Bit Line Drivers (BLDs) 70 and 80. Bit Lines BL0 and BL1 are also respectively coupled to Sense Amplifiers (SAs) 90 and 100 for use during a read operation.

FIG. 1B illustrates table 150 of Bit Line and Word Line voltages for reading and writing (i.e. programming) an OTP memory cell such as cells 10 through 40. Depending on the mode of operation, Bit Line or Word Line can be connected to one of four nodes: GND; $V_{prog}$; $V_{cc}$; or sense (i.e., the sense amplifier input). In a read mode, each cell is either enabled for reading or not enabled. The voltages on Bit Lines BL0 and BL1 and Word Lines WL0 and WL1 are determined from table 150 based on whether an attached cell is enabled or not enabled. Table 150 also shows Bit Line and Word Line voltages for programming a cell and for preventing programming of "non-enabled" cells. As shown, both the BLDs and the WLDs are required to generate $V_{prog}$. In some embodiments, $V_{prog}=4V_{cc}$.

Figures 2A, 2B:
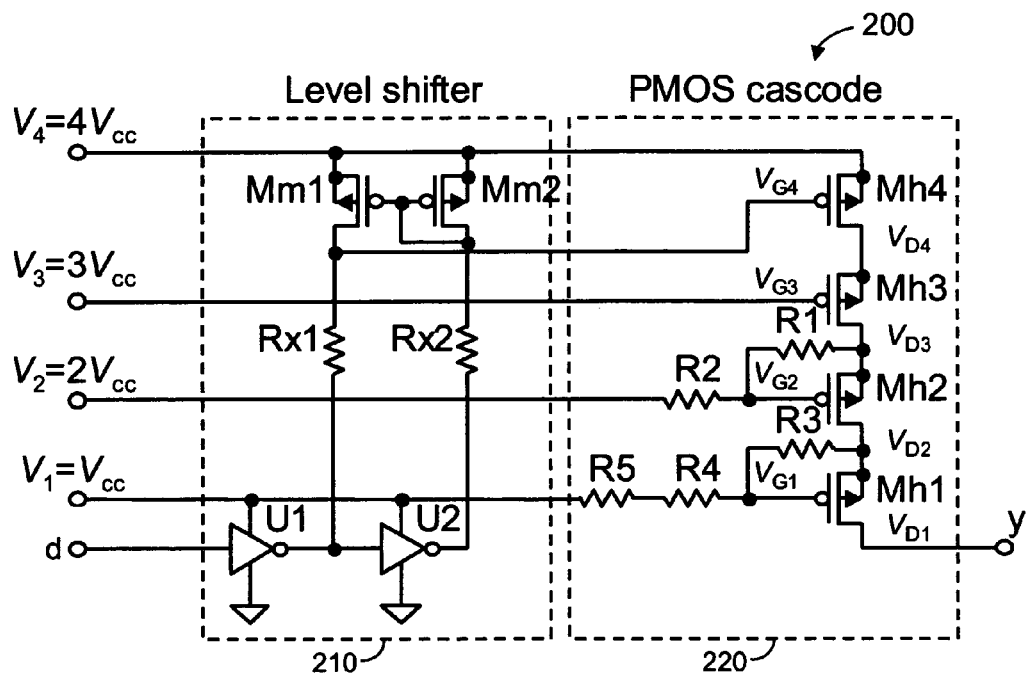
FIG. 2A is a schematic diagram of a pull-up circuit of a driver according to some embodiments.
FIG. 2B is a table of control, internal and output voltages corresponding to different functions of the FIG. 2A circuit according to some embodiments.

FIG. 2A is a schematic diagram of PMOS-based high-side (pull-up) switch 200 according to some embodiments. Switch 200 may be implemented by any of drivers 50, 60, 70 and 90 to provide $V_{prog}$ to an appropriate memory cell. Switch 200 includes level shifter 210 to receive control signal d (range 0-$V_{cc}$), rail voltages $V_4=4V_{cc}$, $V_3=3V_{cc}$, $V_2=2V_{cc}$, and supply voltage $V_1=V_{cc}$. Based on the received signals, components U1, U2, Rx1, Rx2, Mm1, and Mm2 of level shifter 210) generate control signal $V_{G4}$ (range $4V_{cc}$-~$3V_{cc}$).

Cascode stage 220 receives control signal $V_{G4}$ from level shifter 210. Cascode stage 220 comprises a plurality of PMOS transistors Mh4, Mh3, Mh2, and Mh1. A gate voltage of transistor Mh4 is controlled by control signal $V_{G4}$, a gate voltage of transistor Mh3 is controlled by control signal $V_{G3}=V_3=3V_{cc}$, a gate voltage of transistor Mh2 is controlled at least in part by $V_2=2V_{cc}$, and a gate voltage of transistor Mh1 is controlled at least in part by $V_1=V_{cc}$. Resistive network R1 through R5 is coupled to transistors Mh1 through Mh4 to ensure that the transistors' gate-to-source voltage and drain-to-source voltage are maintained at less than or equal to a maximum operational voltage. In some embodiments, R1=R2=R3=R4=R5. Cascode stage 220 also includes output node y for providing cell programming voltage signal $V_{prog}$.

FIG. 2B illustrates table 250 of gate and drain voltages for transistors Mh1 through Mh4 during two functions of pull-up circuit 200. According to the first function, control signal d is 0 to indicate that no programming voltage is required from output node y. Control signal d may be switched to 1 to provide cell programming voltage signal $V_{prog}=4V_{cc}$. As shown in table 250, $|V_G-V_D|$ for each of transistors Mh1 through Mh4 is substantially equal to $V_{cc}$ during each function. According to some embodiments, the foregoing features of circuit 200 may reduce or eliminate a need for thick-oxide transistors to handle high-voltage/high-current switching in OTP memory cell drivers.

Figure 3:
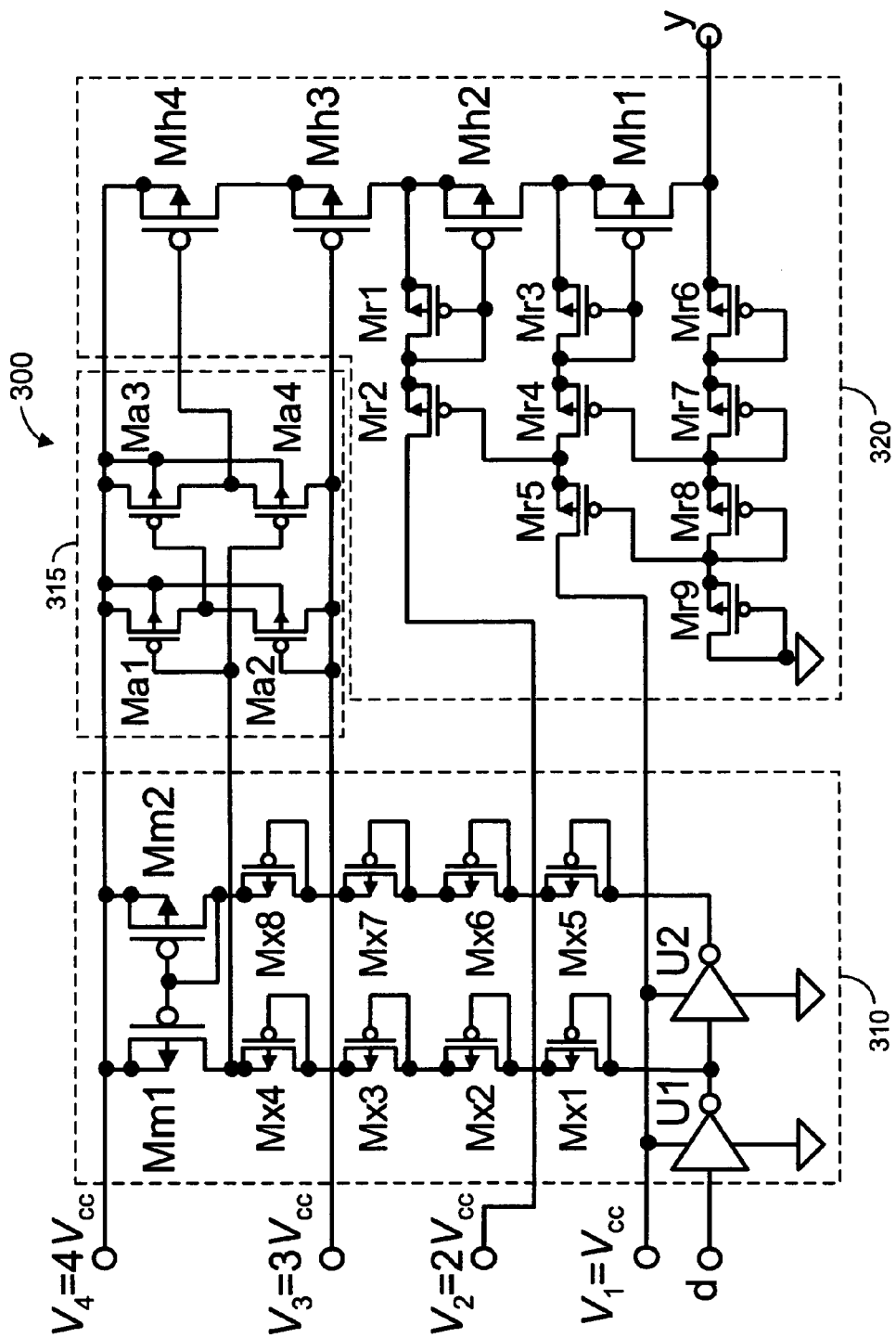
FIG. 3 is a schematic diagram of a pull-up circuit of a driver according to some embodiments.

FIG. 3 is a schematic diagram of high-side pull-up switch 300 according to some embodiments. Switch 300 may be implemented by any of drivers 50, 60, 70 and 90 to provide $V_{prog}$ to an appropriate memory cell via output node y. Switch 300 includes level shifter 310, signal conditioning circuit 315, and cascode stage 320. Level shifter 310 is similar to level shifter 210 of switch 200, with elements Rx1 and Rx2 being replaced with PMOSFETs Mx1 through Mx4 and Mx5 through Mx8, respectively. This replacement may improve the output swing and power supply rejection of level shifter 310 as compared to level shifter 210.

Transistors Ma1-Ma4 of signal conditioning circuit 315 receive $V_{G4}$ from level shifter 310 and, in a case that cell programming voltage signal $V_{prog}$ is not to be output, amplifies $V_{G4}$ to $V_4=4V_{cc}$. The amplified value ensures that transistor Mh4 is turned off.

PMOSFETs Mr1 through Mr9 of cascode stage 320 replace resistor network R1 through R5 of cascode stage 210. PMOSFETs Mr1 through Mr9 are connected in such a way that Mr1 through Mr5 are safely on for d=0 and the gates of transistors Mh1 through Mh4 are therefore held in place. Moreover, for d=1, the gate-to-source voltage of each Mr1 through Mr9 is equal to the drain-to-source voltage, which in turn is equal to $V_{cc}$. The foregoing arrangement may correctly implement the required voltage divider ratios despite the nonlinearity of Mr1 through Mr9.

Figure 4:
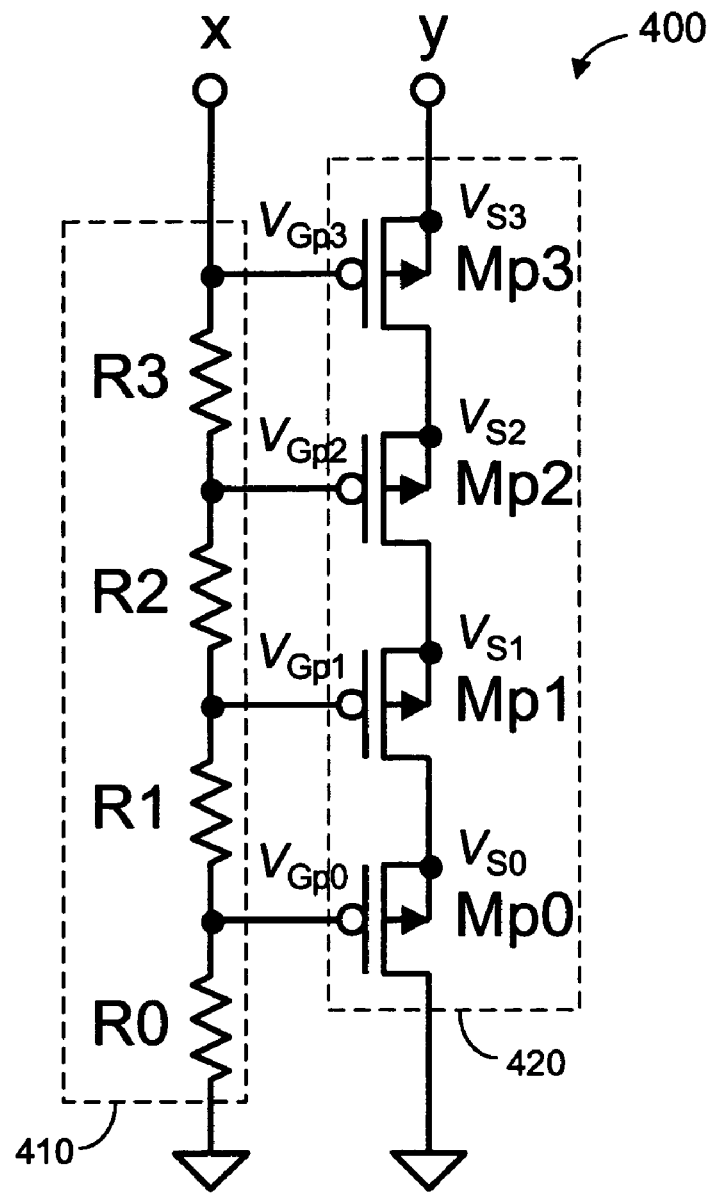
FIG. 4 is a schematic diagram of a pull-down circuit of a driver according to some embodiments.

FIG. 4 is a schematic diagram of PMOS-based low-side (pull-down) switch 400 according to some embodiments. Switch 400 may be implemented by any of drivers 50, 60, 70 and 90 to sink current from an appropriate memory cell via output node y. Voltage divider 410 comprising resistors R0 through R3 receives control voltage x and outputs voltage signals $V_{Gp3}$, $V_{Gp2}$, $V_{Gp1}$, and $V_{Gp0}$ based thereon. PMOS cascode stage 420 comprises transistors Mp0 through Mp3, each of which is controlled by one of voltage signals $V_{Gp3}$, $V_{Gp2}$, $V_{Gp1}$, and $V_{Gp0}$. A source of transistor Mp3 may receive current from a memory cell via a Bit Line.

In operation, pulling control voltage x to $4V_{cc}$ (e.g., using high-side switch 200) may cause output node y to range from $V_x-V_{cc}$ to $V_x+V_t$ without turning on cascode stage 420 and without any of transistors Mp0 through Mp3 exceeding their maximum voltage rating. $V_t$ as used herein denotes a gate-to-source voltage that will cause current flow when a corresponding drain-to-source voltage is non-zero. When x=0, cascode stage 420 turns on and pulls y down to $\sim V_t$. The use of PMOS transistors in low-side switch 400 may reduce or eliminate a need for VDNMOS devices to sink high programming currents in some embodiments.

Figures 5A, 5B:
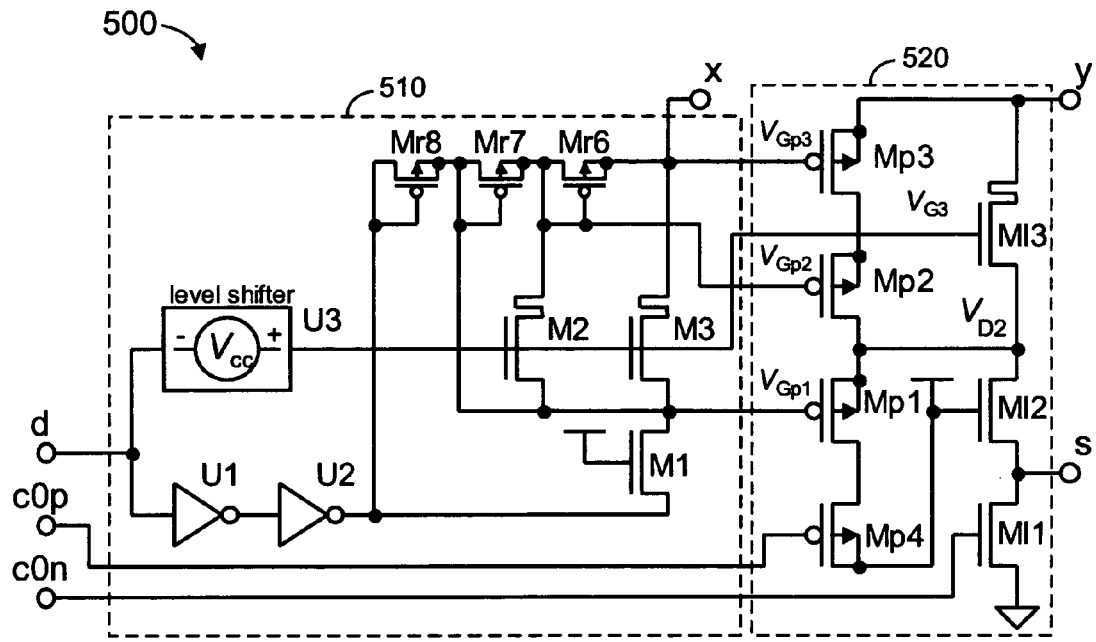
FIG. 5A is a schematic diagram of a pull-down circuit of a driver according to some embodiments.
FIG. 5B is a table of control, internal and output voltages corresponding to different functions of the FIG. 5A circuit according to some embodiments.

FIG. 5A shows pull-down circuit 500 according to some embodiments. As described with respect to switch 400, circuit 500 may be implemented by any of drivers 50, 60, 70 and 90 to sink current from an appropriate memory cell via output node y. With respect to circuit 400, PMOSFET Mp4 has been added to allow application of $V_{cc}$ at the output, which may be required on a Word Line during a read mode, as shown in table 150. If circuit 500 is used in a BLD, VDNMOS transistor Ml3 ensures current flow for $V_y<V_t$ during the read mode. A Sense Amplifier input may be connected to node s, which does not exceed $V_{cc}$.

The resistors R0 through R3 of divider 410 are replaced by transistors Mr6 through Mr8 and M1 through M3, which ensure that $V_{Gp1}$, $V_{Gp2}$ and $V_{Gp3}$ are pulled to ground when switch 500 is on (i.e., Function=GND). The level shifter U3 provides $|V_{gs}|<=V_{cc}$ for M2, M3 and M13. The pull-down current of switch 500 at a given area can be improved by adding an NMOS cascode such as Ml1 and Ml2 controlled by c0n:c0n=$V_{cc}$|x=0, c0n=0|x=$4V_{cc}$. FIG. 5B shows table 550 of voltages within circuit 500 that correspond to each function specified in table 150 of FIG. 1B. Control signals c0n, c0p and d may be generated by combinatorial logic or any other systems.

Figure 6A:
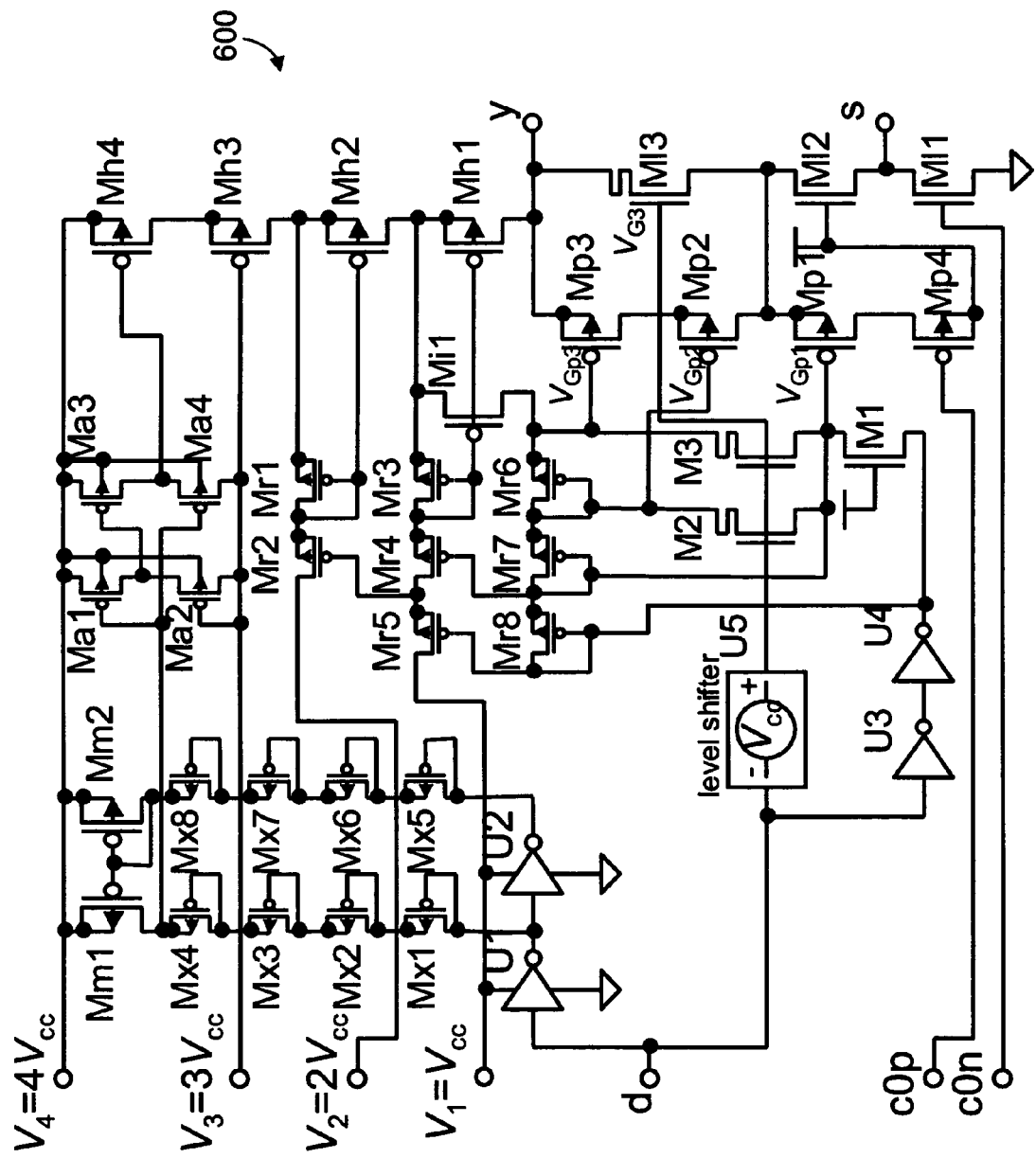
FIG. 6A is a schematic diagram of a driver for programming and reading a read-only memory cell according to some embodiments.

FIG. 6A is a schematic diagram of a driver according to some embodiments. Driver 600 roughly combines switch 300 of FIG. 3 with switch 500 of FIG. 5A. Accordingly, driver 600 may comprise any of drivers 50, 60, 70 and 90 of FIG. 1A. Transistors Mr6 through Mr8 are shared between high-side and low-side portions of driver 600, and transistor Mr9 of circuit 300 is omitted. A PMOSFET, Mi1, pulls $V_{Gp3}$ (node x of FIG. 4) to $4V_{cc}$ when the high-side portion is on.

FIG. 6B shows a table of control signals c0n, c0p and d and corresponding outputs for driver 600. The control signals can be generated by combinatorial logic or any other systems, including but not limited to firmware and software.

Figure 7:
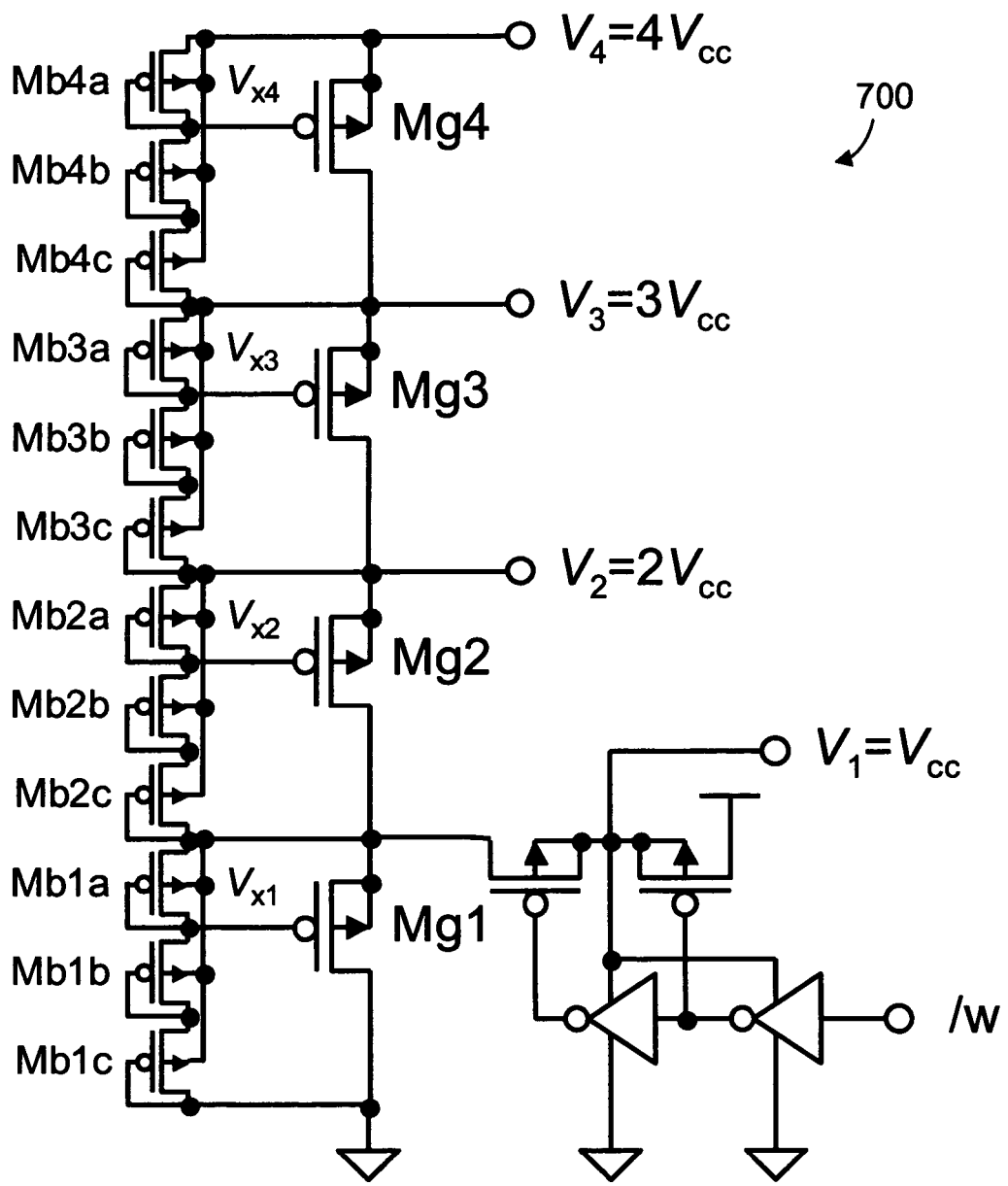
FIG. 7 is a schematic diagram of a voltage regulator according to some embodiments.

FIG. 7 is a schematic diagram of voltage regulator 700 to generate the rail voltages V1 through V4 in some embodiments. Transistors Mg1 through Mg4 generally operate as stacked shunt regulators, which support currents through transistors Mr1 through Mr5 and Ma1 through Ma4, and also supply level shifter U5. Rail voltages V2 thru V4 are required only during programming (/w=0). Accordingly, V4 may be grounded during a read mode (/w=1), reducing the currents drawn by the voltage divider networks of circuit 600, while the low-side switches continue to work as WLDs and BLDs for the read operation.

Figure 8A:
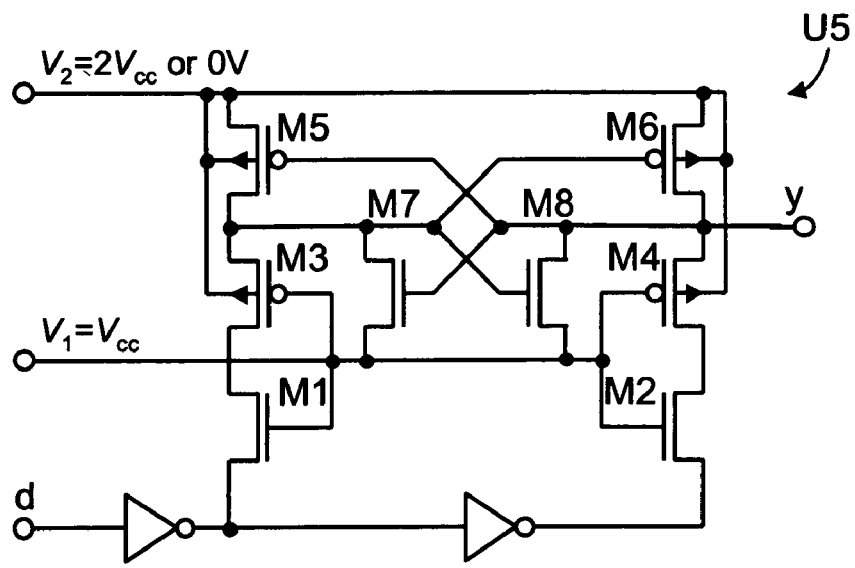
FIG. 8A is a schematic diagram of a level shifter according to some embodiments.
Figure 8B:
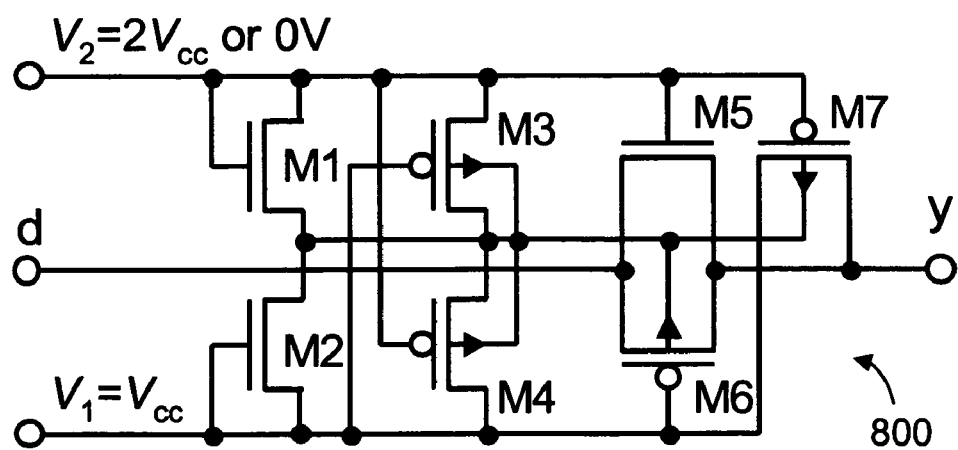
FIG. 8B is a schematic diagram of a bypass circuit according to some embodiments.

FIG. 8A shows level shifter U5 of circuit 600 according to some embodiments. In some embodiments, output node y of level shifter U5 is coupled to node d of bypass circuit 800 shown in FIG. 8B. Such an arrangement allows the collapse of V4, V3, and V2 to 0V during a read mode. For example, bypass circuit 800 passes the output of level shifter U5 through to node y if $V2=2V_{cc}$, and holds node y at $V_{cc}$ if V2=0V.

Figure 9:
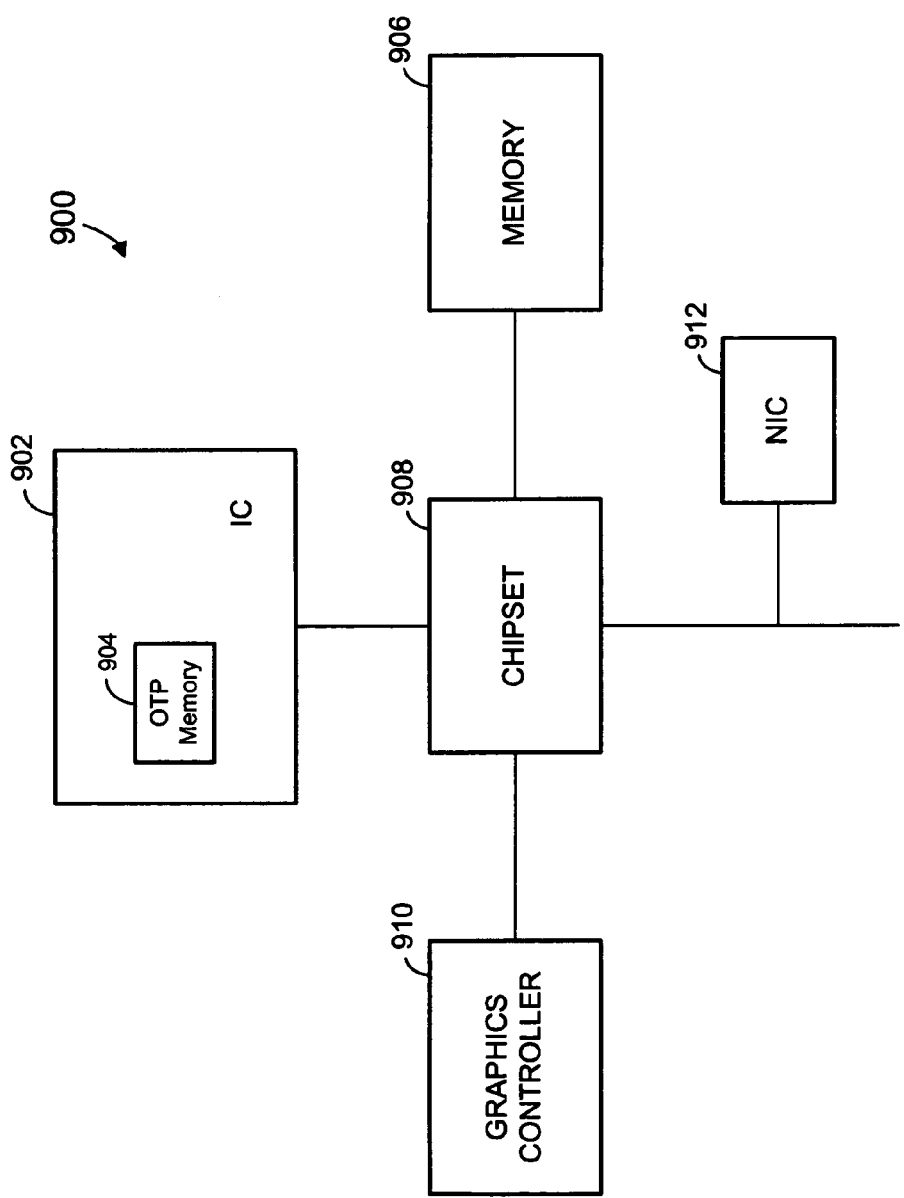
FIG. 9 is a block diagram of a system according to some embodiments.

FIG. 9 illustrates a block diagram of system 900 according to some embodiments. System 900 includes integrated circuit (IC) 902 which may comprise a microprocessor. IC 902 includes OTP memory 904 for storing an IC identifier, IC speed, and/or any other suitable information. OTP memory 904 may include an array of OTP memory cells and associated BLDs and WLDs such as driver 600.

Integrated circuit 902 may communicate with memory 906 via chipset 908. Memory 906 may comprise any type of memory for storing data, such as a Single Data Rate Random Access Memory, a Double Data Rate Random Access Memory, or a Programmable Read Only Memory. Other off-die functional units, such as graphics controller 910 and Network Interface Controller (NIC) 912, may communicate with integrated circuit 902 via appropriate busses or ports.

Some embodiments may provide high-voltage driver circuits that avoid heavy usage of VDNMOS devices and large reverse-bias voltages across source/drain-to-substrate junctions. Some embodiments perform high-voltage/high-current switching with cascoded PMOS transistors, and use VDNMOS devices only to control and signal transmission.

The several embodiments described herein are solely for the purpose of illustration. Embodiments may include any currently or hereafter-known versions of the elements described herein. Therefore, persons in the art will recognize from this description that other embodiments may be practiced with various modifications and alterations.

What is claimed is:

1. An apparatus to program a read-only memory cell, comprising:
   a pull-up circuit comprising:
      a level shifter to receive a control signal, a supply voltage, and one of more of a plurality of rail voltages, each of the plurality of rail voltages substantially equal to a respective integer multiple of the supply voltage, and to generate a second control signal; and
   a cascode stage comprising:
      a plurality of transistors, a gate voltage of each of the plurality of transistors to be controlled at least in part by a respective one of the second control signal, the supply voltage, and at least one of the plurality of rail voltages;

a resistive network coupled to the plurality of transistors, the resistive network to maintain a gate-to-source voltage and a gate-to-drain voltage of each of the plurality of transistor at less than a maximum operational voltage; and an output node to provide a cell programming signal.

2. An apparatus according to claim 1, the cascode stage comprising:

a first PMOS transistor, a gate of the first PMOS transistor to receive the second control signal and a first source of the first PMOS transistor to receive a first one of the plurality of rail voltages;

a second PMOS transistor, a gate of the second PMOS transistor to receive a second one of the plurality of rail voltages, and a first source of the second PMOS transistor being coupled to a second source of the first PMOS transistor;

a first resistive element coupled to a second source of the second PMOS transistor;

a second resistive element coupled to the first resistive element and to a third one of the plurality of rail voltages;

a third PMOS transistor, a first source of the third PMOS transistor being coupled to the second source of the second PMOS transistor, and a gate of the third PMOS transistor coupled to the first resistive element and to the second resistive element;

a third resistive element coupled to a second source of the third PMOS transistor;

a fourth resistive element coupled to the third resistive element and to the supply voltage; and a fourth PMOS transistor, a first source of the fourth PMOS transistor being coupled to the second source of the third PMOS transistor, a gate of the third PMOS transistor begin coupled to the third resistive element and to the fourth resistive element, and a second source of the fourth PMOS transistor being coupled to the output node.

3. An apparatus according to claim 2, wherein the first rail voltage is greater than the second rail voltage, the second rail voltage is greater than the third rail voltage, and the third rail voltage is greater than the supply voltage.

4. An apparatus according to claim 3, wherein the first rail voltage is substantially equal to four times the supply voltage, the second rail voltage is substantially equal to three times the supply voltage, and the third rail voltage is substantially equal to twice the supply voltage.

5. An apparatus according to claim 3, wherein the fourth resistive element comprises a fifth resistive element and a sixth resistive element, and wherein the first, second, third, fifth and sixth resistive elements exhibit a substantially identical resistance.

6. An apparatus according to claim 1, wherein the second control signal provides a voltage that is less than or equal to a highest one of the plurality of rail voltages and greater than or equal to a second-highest one of the plurality of rail voltages.

7. An apparatus according to claim 1, the pull-up circuit further comprising:

a signal conditioning circuit to receive the second control signal from the level shifter, to amplify the second control signal to a highest one of the plurality of rail voltages in a case that no cell programming signal is to be output.

8. An apparatus according to claim 1, further comprising:
a pull-down circuit comprising:

a voltage divider to receive a control voltage and to output a plurality of voltage signals based on the control voltage; and a second cascode stage comprising a second plurality of transistors, a gate voltage of each of the second plurality of transistors to be controlled at least in part by a respective one of the plurality of voltage signals and the control voltage, and a first source of one of the second plurality of transistors being coupled to the output node to receive current from the memory cell.

9. An apparatus according to claim 8, the pull-down circuit further comprising:

a level shifter; and a bypass circuit to pass through an output of the level shifter in a case that the memory cell is being programmed, and to limit the output to the supply voltage in a case that the memory cell is not being programmed.

10. A system comprising:

a microprocessor comprising a memory, the memory comprising:

a plurality of memory cells;

a pull-up circuit comprising:

a level shifter to receive a control signal, a supply voltage, and one of more of a plurality of rail voltages, each of the plurality of rail voltages substantially equal to a respective integer multiple of the supply voltage, and to generate a second control signal; and a cascode stage comprising:

a plurality of transistors, a gate voltage of each of the plurality of transistors to be controlled at least in part by a respective one of the second control signal, the supply voltage, and at least one of the plurality of rail voltages;

a resistive network coupled to the plurality of transistors, the resistive network to maintain a gate-to-source voltage and a gate-to-drain voltage of each of the plurality of transistor at less than a maximum operational voltage; and an output node to provide a cell programming signal; and a double-data rate random access memory in communication with the microprocessor.

11. A system according to claim 10, the cascode stage comprising:

a first PMOS transistor, a gate of the first PMOS transistor to receive the second control signal and a first source of the first PMOS transistor to receive a first one of the plurality of rail voltages;

a second PMOS transistor, a gate of the second PMOS transistor to receive a second one of the plurality of rail voltages, and a first source of the second PMOS transistor being coupled to a second source of the first PMOS transistor;

a first resistive element coupled to a second source of the second PMOS transistor;

a second resistive element coupled to the first resistive element and to a third one of the plurality of rail voltages;

a third PMOS transistor, a first source of the third PMOS transistor being coupled to the second source of the second PMOS transistor, and a gate of the third PMOS transistor coupled to the first resistive element and to the second resistive element;

a third resistive element coupled to a second source of the third PMOS transistor;

a fourth resistive element coupled to the third resistive element and to the supply voltage; and a fourth PMOS transistor, a first source of the fourth PMOS transistor being coupled to the second source of the third PMOS transistor, a gate of the third PMOS transistor begin coupled to the third resistive element and to the fourth resistive element, and a second source of the fourth PMOS transistor being coupled to the output node.

12. A system according to claim 11, wherein the first rail voltage is greater than the second rail voltage, the second rail voltage is greater than the third rail voltage, and the third rail voltage is greater than the supply voltage.

13. A system according to claim 12, wherein the first rail voltage is substantially equal to four times the supply voltage, the second rail voltage is substantially equal to three times the supply voltage, and the third rail voltage is substantially equal to twice the supply voltage.

14. A system according to claim 12, wherein the fourth resistive element comprises a fifth resistive element and a sixth resistive element, and wherein the first, second, third, fifth and sixth resistive elements exhibit a substantially identical resistance.

15. A system according to claim 10, the pull-up circuit further comprising:

a signal conditioning circuit to receive the second control signal from the level shifter, to amplify the second control signal to a highest one of the plurality of rail voltages in a case that no cell programming signal is to be output.

16. A system according to claim 10, further comprising:

a pull-down circuit comprising:

a voltage divider to receive a control voltage and to output a plurality of voltage signals based on the control voltage; and a second cascode stage comprising a second plurality of transistors, a gate voltage of each of the second plurality of transistors to be controlled at least in part by a respective one of the plurality of voltage signals and the control voltage, and a first source of one of the second plurality of transistors being coupled to the output node to receive current from the memory cell.

17. A system according to claim 16, the pull-down circuit further comprising:

a level shifter; and a bypass circuit to pass through an output of the level shifter in a case that the memory cell is being programmed, and to limit the output to the supply voltage in a case that the memory cell is not being programmed.

* * * * *